(12) United States Patent
Miyazawa et al.

(10) Patent No.: US 8,746,853 B2
(45) Date of Patent: Jun. 10, 2014

(54) PIEZOELECTRIC ELEMENT, LIQUID EJECTING HEAD, LIQUID EJECTING APPARATUS

(75) Inventors: Hiromu Miyazawa, Azumino (JP); Hiroaki Tamura, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/338,055

(22) Filed: Dec. 27, 2011

(65) Prior Publication Data

US 2012/0162321 A1 Jun. 28, 2012

(30) Foreign Application Priority Data

Dec. 28, 2010 (JP) ................................. 2010-294297

(51) Int. Cl.
*B41J 2/045* (2006.01)
(52) U.S. Cl.
USPC .......................................................... 347/68
(58) Field of Classification Search
None
See application file for complete search history.

(56) References Cited

U.S. PATENT DOCUMENTS

2009/0243438 A1* 10/2009 Hamada et al. ............... 310/358
2009/0267062 A1* 10/2009 Nakahara et al. ............... 257/43
2010/0231095 A1*  9/2010 Kubota et al. ................. 310/357
2010/0308692 A1   12/2010 Kobayashi et al.
2011/0164095 A1*  7/2011 Nawano et al. ................. 347/71

FOREIGN PATENT DOCUMENTS

JP      2001-223404      8/2001

OTHER PUBLICATIONS

Xiang; N-Doped LaALO3/Si(100) Films with High-k, Low-Leakage Current and Good Thermal Stability; Chinese Physics Letters; Jan. 2005; vol. 22; No. 1.

* cited by examiner

*Primary Examiner* — Matthew Luu
*Assistant Examiner* — Erica Lin
(74) *Attorney, Agent, or Firm* — Workman Nydegger (57) ABSTRACT

A piezoelectric element comprises a piezoelectric layer and an electrode provided to the piezoelectric layer. The piezoelectric layer has a Perovskite-type structure containing bismuth and iron, and includes nitrogen in an oxygen site of the Perovskite-type structure.

6 Claims, 12 Drawing Sheets

FIG. 4
BiFeO$_3$

FIG. 5
BiFeO$_3$ + Bi_defect

PIEZOELECTRIC ELEMENT, LIQUID EJECTING HEAD, LIQUID EJECTING APPARATUS

CROSS-REFERENCE TO RELATED APPLICATIONS

The entire disclosure of Japanese Patent Application No. 2010-294297, filed Dec. 28, 2010 is expressly incorporated by reference.

BACKGROUND

1. Technical Field

The present invention relates to a liquid ejecting head and liquid ejecting device having a piezoelectric element causing a pressure change in a pressure generating chamber communicating with a nozzle opening and having a piezoelectric layer and an electrode that applies a voltage to the piezoelectric layer, and the piezoelectric element.

2. Related Art

A piezoelectric actuator for a liquid ejecting head may use a piezoelectric element configured by interposing a piezoelectric layer made of piezoelectric material showing an electromechanical transduction function, for example, crystallized dielectric material, between two electrodes. As a representative example of the liquid ejecting head, there is an ink jet recording head in which a pressure generating chamber communicating with a nozzle opening discharging ink droplets is partially configured as a vibration plate so that the ink in the pressure generating chamber is pressed by transforming the vibration plate by the piezoelectric element to be discharged as ink droplets from the nozzle opening.

The piezoelectric material used for the piezoelectric layer (piezoelectric ceramics) of the piezoelectric element requires high piezoelectric features, as a representative example of such lead zirconate titanate (PZT) is given (JP-A-2001-223404).

However, from the viewpoint of environmental problems, piezoelectric material where the content of lead is suppressed is demanded. As a piezoelectric material not containing lead, there is $BiFeO_3$ having a Perovskite-type structure expressed by $ABO_3$. Here, A and B of $ABO_3$ represent an A site and a B site, which are respectively sites where oxygen is 12-coordinated and 6-coordinated. However, the $BiFeO_3$-based piezoelectric material has low insulation and tends to cause a leakage current. If a leakage current tends to occur, particularly when a high voltage is applied, cracks may tend to be generated, and so the material is not useful for the liquid ejecting head. Therefore, for example, piezoelectric material may have high insulation of $1 \times 10^{-3}$ A/cm$^2$ or less when a representative driving voltage of 25 V is applied.

In addition, this problem is present not only in the ink jet recording head but also in other liquid ejecting heads which discharge liquid droplets other than ink and the piezoelectric element used for equipment other than the liquid ejecting heads. Further, the leakage current problem causes a serious problem of the increase of energy consumption when the piezoelectric element is used as a sensor. For example, a low leakage current is desirable even for piezoelectric elements used for piezoelectric sensors, infrared sensors, temperature sensors and pyroelectric sensors to which a voltage of 1 V or less is applied.

SUMMARY

An advantage of some aspects of the invention is that it provides a liquid ejecting head, a liquid ejecting device and a piezoelectric element, which decreases an environmental burden, and has high insulation so that leakage current is suppressed.

According to an aspect of the invention, there is provided a liquid ejecting head, which includes a pressure generating chamber communicating with a nozzle opening; and a piezoelectric element having a piezoelectric layer and an electrode installed to the piezoelectric layer, wherein the piezoelectric layer is made of complex oxide having a Perovskite-type structure containing bismuth and iron so that nitrogen is included in an oxygen site.

In this aspect, the piezoelectric element has high insulation so that leakage current is suppressed, resulting in great durability. In addition, since lead is not contained, the burden on the environment may decrease.

Here, it is preferable that the nitrogen be included by a mole ratio equal to or greater than 0.0005 and equal to or smaller than 0.01.

In addition, it is preferable that the bismuth be partially included in a B site.

In addition, it is preferable that the complex oxide further includes titanium and barium in addition to bismuth and iron. By doing so, the liquid ejecting head may have a piezoelectric element with further superior piezoelectric characteristics (amount of deformation).

According to another aspect of the invention, there is provided a liquid ejecting device including the liquid ejecting head of the above aspect.

In this aspect, since the piezoelectric element has high insulation due to the suppression of leakage current, it is possible to implement a liquid ejecting device with excellent durability. In addition, since lead is not contained, the burden on the environment may decrease.

According to still another aspect of the invention, there is provided a piezoelectric element which includes a piezoelectric layer and an electrode installed to the piezoelectric layer, wherein the piezoelectric layer is made of complex oxide having a Perovskite-type structure containing bismuth and iron so that nitrogen is included in an oxygen site.

In this aspect, it is possible to implement a piezoelectric element with excellent insulation so that leakage current is suppressed. In addition, since lead is not contained, the burden on the environment may decrease.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
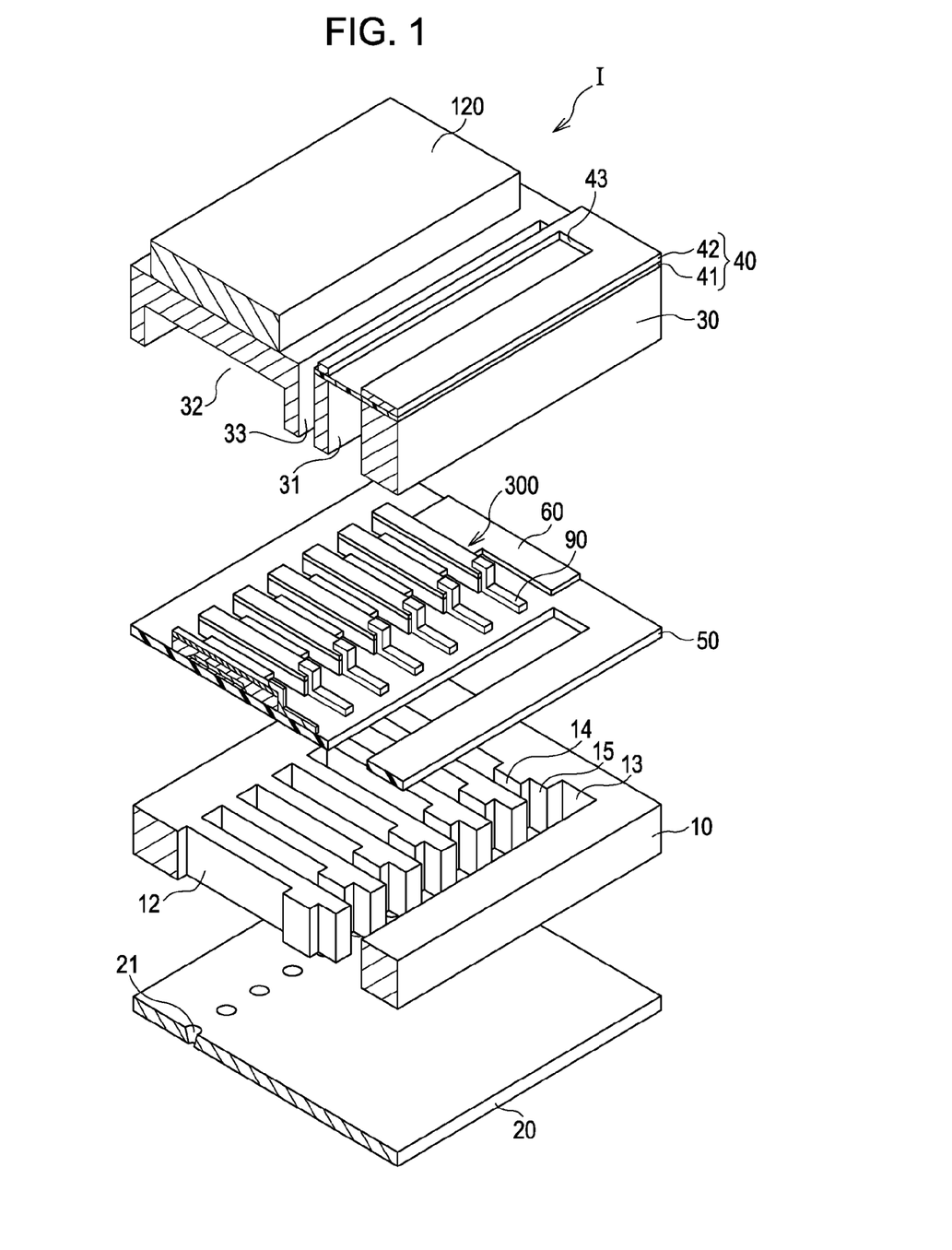
FIG. 1 is an exploded perspective view showing a schematic configuration of a recording head according to a first embodiment.
Figure 2:
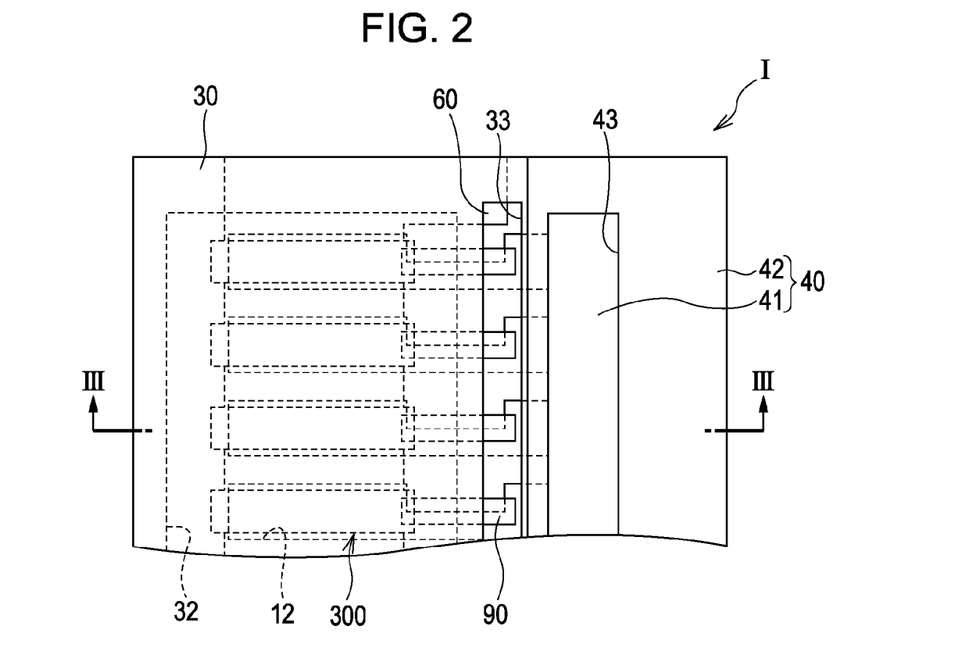
FIG. 2 is a plan view of the recording head according to the first embodiment.
Figure 3:
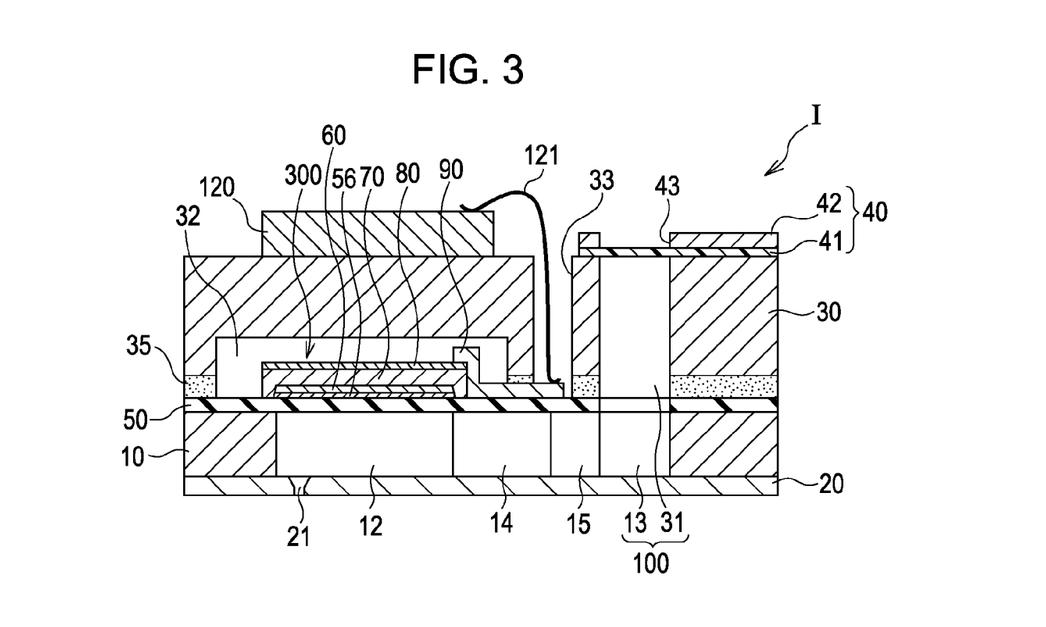
FIG. 3 is a sectional view of the recording head according to the first embodiment.

FIG. 1 an exploded perspective view showing a schematic configuration of an ink jet recording head which is an example of a liquid ejecting head according to a first embodiment of the invention, FIG. 2 is a plan view of FIG. 1, and FIG. 3 is a sectional view taken along the line III-III of FIG. 2. As shown in FIGS. 1 to 3, a channel-formed substrate 10 of this embodiment is formed with a silicon single crystal substrate, and an elastic film 50 made of silicon dioxide is formed on one surface thereof.

A plurality of pressure generating chambers 12 are installed to the channel-formed substrate 10 in the width direction thereof. In addition, a communication portion 13 is formed in the outer portion of the pressure generating chamber 12 of the channel-formed substrate 10 in the longitudinal direction so that each pressure generating chamber 12 communicates with the communication portion 13 via an ink supply path 14 and a communication path 15 installed for each pressure generating chamber 12. The communication portion 13 communicates with a manifold portion 31 of a protective substrate described later to configure a part of a manifold which becomes a common ink chamber of each pressure generating chamber 12. The ink supply path 14 is formed with a smaller width than the pressure generating chamber 12 so that a channel resistance of the ink introduced from the communication portion 13 to the pressure generating chamber 12 is maintained consistently. In addition, even though the ink supply path 14 is formed by squeezing the channel in the width direction from one side in this embodiment, it may also be formed by squeezing the channel in the width direction from both sides. In addition, the ink supply path may also be formed by squeezing the channel not in the width direction but in the thickness direction. In this embodiment, a liquid channel composed of the pressure generating chamber 12, the communication portion 13, the ink supply path 14 and the communication path 15 is installed to the channel-formed substrate 10.

In addition, a nozzle plate 20 in which a nozzle opening 21 communicating with the vicinity of the end portion of each pressure generating chamber 12 opposite to the ink supply path 14 is formed is adhered to the opening surface side of the channel-formed substrate 10 by means of an adhesive or thermal adhesion. In addition, the nozzle plate 20 is made of, for example, glass ceramics, silicon single crystal substrate, stainless steel, or the like.

Meanwhile, the elastic film 50 is formed at the side of the channel-formed substrate 10 opposite to the opening surface, as described above, and an adhesive film 56 made of titanium oxide with, for example, a thickness of about 30 to 50 nm to improve adhesion with the base of a first electrode 60 of the elastic film 50 is installed on the elastic film 50. In addition, an insulator film made of zirconium oxide may also be installed on the elastic film 50 as necessary.

Further, the first electrode 60, a thin-film piezoelectric layer 70 with a thickness of 2 μm or less, preferably 0.3 to 1.5 μm, and a second electrode 80 are laminated on the adhesion film 56 to configure a piezoelectric element 300. Here, the piezoelectric element 300 is defined as including the first electrode 60, the piezoelectric layer 70 and the second electrode 80. Generally, any one electrode of the piezoelectric element 300 may be set to be a common electrode, and the electrode and the piezoelectric layer 70 are configured by patterning each pressure generating chamber 12. In this embodiment, the first electrode 60 is set to be a common electrode of the piezoelectric element 300, and the second electrode 80 is set to be an individual electrode of the piezoelectric element 300, but this configuration may be set reversely in consideration of driving circuits or wirings. In addition, here, the piezoelectric element 300 and a vibration plate causing displacement by the operation of the corresponding piezoelectric element 300 are called an actuator device when combined. In addition, in the above example, the elastic film 50, the adhesion film 56, the first electrode 60, and the insulator film which is provided as necessary serve as the vibration plate, but, for example, the elastic film 50 or the adhesion film 56 may not be provided without being limited to the above. In addition, the piezoelectric element 300 itself may be configured to substantially serve as the vibration plate.

Hereinafter, the Perovskite-type structure of the complex oxide including transition metal is written as $ABO_3$. Here, the A site and the B site respectively represent sites where oxygen is 12-coordinated and 6-coordinated.

In this embodiment, the piezoelectric layer 70 is made of complex oxide having the Perovskite-type structure containing bismuth (Bi) and ion (Fe), and therefore nitrogen is included in the oxygen site. By doing so, as described later, leakage current is suppressed, and insulation may be improved. In addition, since lead is not contained, the burden on the environment may decrease.

The complex oxide according to this embodiment may include bismuth at the A site of the Perovskite-type structure and iron at the B site, but the bismuth and ion at the A and B sites may be substituted with other elements. For example, a substitution element of the A site may be lanthanum, praseodymium, neodymium, samarium, yttrium, or the like, and a substitution element of the B site may be cobalt, chrome, manganese, nickel, copper, or the like.

Bismuth included in $BiFeO_3$ or the like may easily volatilize during a manufacturing process, particularly during a firing process of the piezoelectric layer, and may tend to cause crystal defects of the A site. The lost Bi diffuses under the circumstance of a manufacturing chamber or toward the lower electrode. As Bi is released, oxygen is lost in order to keep the balance of electron number. The ratio of Bi defects to oxygen defects is 2:3 in order to satisfy the charge neutral principle. The presence of oxygen loss lowers the orbital energy of a d electron of the transition metal by means of Coulomb potential so that the band gap of the piezoelectric element is narrowed, which resultantly becomes a direct factor causing leakage current. In order to suppress oxygen loss, it is desirable to suppress Bi loss. For this purpose, it may be considered to include Bi excessively in advance in the stoichiometric composition, but the excessive Bi is released into not only the A site but also the B site unintentionally at a consistent rate. Bi released into the B site becomes a source of an electron carrier, which causes leakage current to the piezoelectric element. For this reason, in the system of $BiFeO_3$, it is difficult to use a manufacturing method where Bi is excessively included in the stoichiometric composition.

Figure 7:
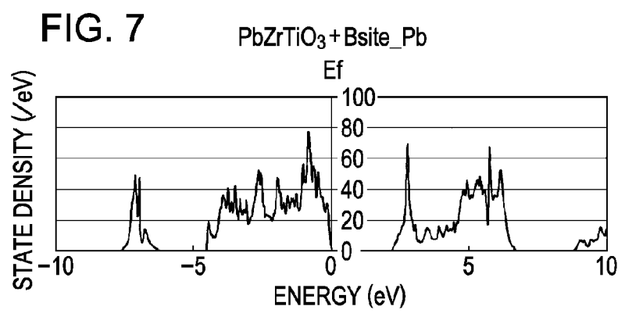
FIG. 7 is a diagram showing density of electron states when 12.5% of transition metal at the B site is substituted with Pb for $PbZrTiO_3$.

Here, in lead zirconate titanate ($PbZrTiO_3$) which was used in the related art, lead (Pb) may tend to volatilize during the manufacturing process, similar to Bi. For this reason, a method where Pb is excessively included in the stoichiometric composition is used. The excessive Pb causes a phenomenon in which Pb is released into the B site unintentionally. However, in the PZT, as shown in FIG. 7 described later, even though Pb is unintentionally included in the B site, the band gap in the electron structure may be maintained. For this reason, in a case where $PbZrTiO_3$ is manufactured, even though the method where Pb is excessively included in advance in the stoichiometric composition, the insulation of the piezoelectric body is not deteriorated.

After further investigating the above problems by using the first principle electron state calculation, the following findings were obtained.

FIGS. 4 to 8 are diagrams showing density of electron states of each crystal, necessary for the first principle electron state calculation, where the horizontal axis represents an energy difference (eV) of electrons and the vertical axis represents density of electron states (DOS: Density Of State). In addition, a plus side greater than the state density 0 (/eV) represents up-spin, and a minus side represents down-spin. As the condition for the first principle electron state calculation, the ultra soft pseudopotential method based on the density functional approach in the range of the generalized gradient approximation (GGA) was used. For the transition metal atom of the B site, in order to give a strong correlation effect originated from the localization of the d electron orbit, the GGA+U method (GGA plus U method) was applied. The cutoffs of the wave function and the charge density were respectively 20 Hartree and 360 Hartree. The super cell of the crystal used for the calculation was configured by using an eight (2×2×2=8) $ABO_3$ type Perovskite-type structure. In addition, the mesh at the inverse lattice point (k point) was (4×4×4).

Figure 4:
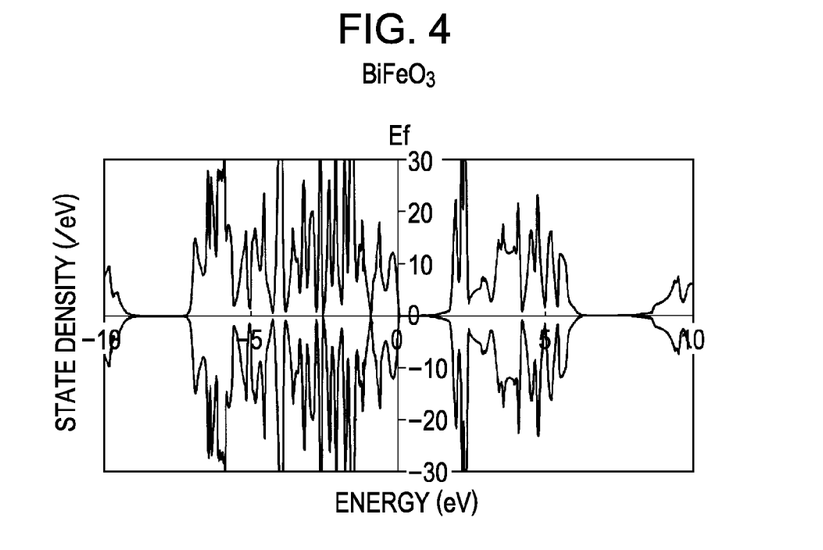
FIG. 4 is a diagram showing density of electron states of $BiFeO_3$ perfect crystal.
Figure 5:
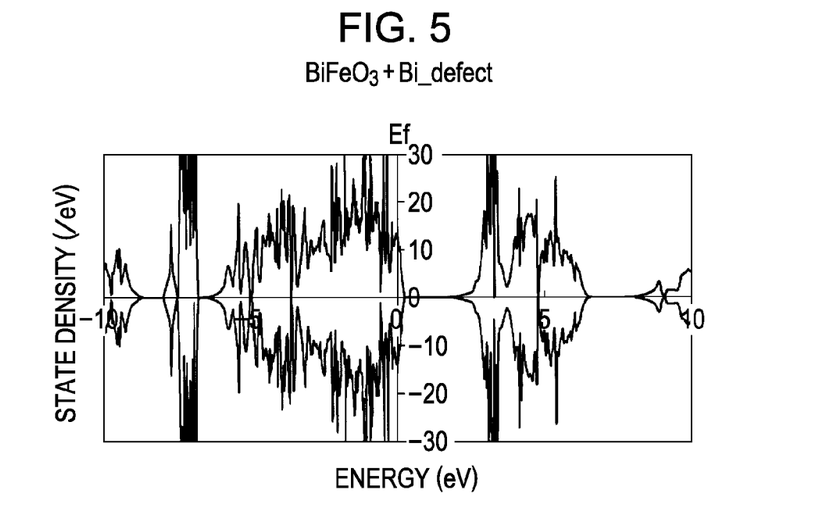
FIG. 5 is a diagram showing density of electron states when Bi of $BiFeO_3$ has a 12.5% defect in an A site.
Figure 6:
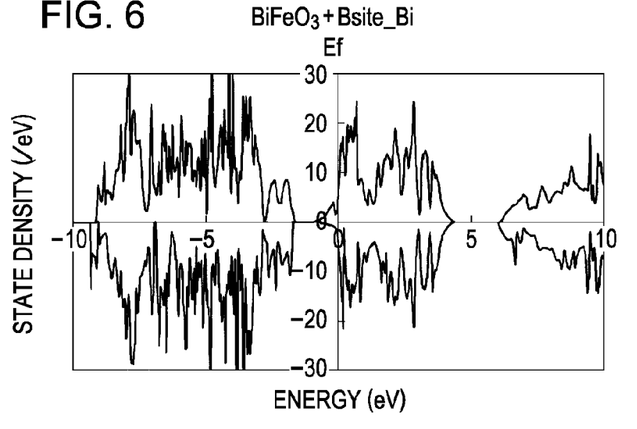
FIG. 6 is a diagram showing density of electron states when 12.5% of Fe of $BiFeO_3$ at a B site is substituted with Bi.
Figure 8:
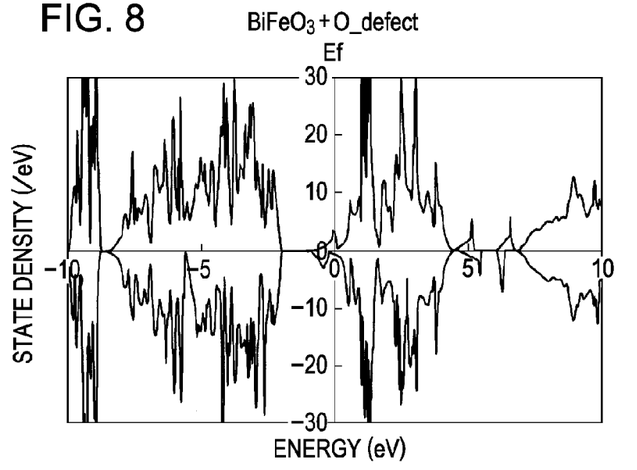
FIG. 8 is a diagram showing density of electron states when 4% of oxygen loss occurs in an oxygen site of $BiFeO_3$.

FIG. 4 is a diagram showing density of electron states of a perfect crystal of bismuth ferric acid ($BiFeO_3$), FIG. 5 is a diagram showing density of electron states when 12.5% of Bi at the A site of bismuth ferric acid ($BiFeO_3$) is defective, FIG. 6 is a diagram showing density of electron states when 12.5% of Bi is included in the B site of bismuth ferric acid ($BiFeO_3$), FIG. 7 is a diagram showing that 12.5% of Pb is included in the B site of PZT, and FIG. 8 is a diagram showing density of electron states when 4% loss occurs at the oxygen site of bismuth ferric acid ($BiFeO_3$).

The system exhibits stable antiferromagnetic states in all of FIGS. 4, 5, 6, 7 and 8.

As shown in FIG. 4, in the case of $BiFeO_3$ perfect crystal, namely in a case where each site has no hole and Bi is not substituted with another element, the highest electron occupancy level (Ef) is the top of the valence band, and therefore the band gap is opened to ensure insulation. In FIG. 4, a side state in a lower energy for the band gap is a charged band, and a side state in a higher energy is a conductive band.

In addition, the highest electron occupancy level represents a level of the highest orbital energy occupied by electrons, which corresponds to one-electron energy capable of being obtained by the electron state simulation. In each graph of the density of electron states, 0 point of the horizontal axis is set to be the highest electron occupancy level (Ef).

As shown in FIG. 5, for $BiFeO_3$, if bismuth (Bi) of the A site is partially lost and causes defects, hole state density is shown at the plus side greater than the energy of 0 eV. In other words, the highest electron occupancy level comes to be in the energy region of the valence band. Therefore, it could be understood that the insulation of the system is deteriorated to create hole carriers, and its electric conduction type is p type. At this time, it could be understood that the loss of Bi of the A site gives three hole carriers, which requires the area of the hole state density.

In addition, as shown in FIG. 6, if bismuth (Bi) is included in the B site, the state density occupied by the minus side smaller than the energy of 0 eV is shown. In other words, the highest electron occupancy level comes to be in the energy region of the conductive band. Therefore, the system is not isolative, and it could be understood that it becomes an n-type since electron carriers are generated. At this time, it could be understood that Bi of the B site gives one electron carrier, which requires the area of the occupied state density.

In FIG. 7, the density of electron states where Pb is included in the B site in PZT is shown. In the PZT-based piezoelectric material, even though Pb is unintentionally included in the B site, as shown in FIG. 7, the band gap in the electron structure may be maintained. Therefore, in a case where $PbZrTiO_3$ is manufactured, even though a method of excessively including Pb in the stoichiometric composition in advance is used, the insulation of the piezoelectric body is not deteriorated.

In addition, as shown in FIG. 8, if 4% loss occurs in the oxygen site of $BiFeO_3$, the occupied state density is shown at the minus side smaller than the energy of 0 eV. In other words, the highest electron occupancy level comes to be in the energy region of the conductive band. Therefore, the system is not isolative, and it could be understood that it becomes an n-type as electron carriers are generated. At this time, it could be understood that the loss of the oxygen site gives two electron carriers, which require the area of the occupied state density.

Therefore, as shown in FIGS. 5, 6 and 8, in $BiFeO_3$, n-type defects and p-type defects coexist. For example, in the case of a semiconductor, since carriers in the conductive band and the charged band have a free electron state, hole carriers originated from p-type defects and electron carriers originated from n-type defects spread spatially, which may be negative to each other. Meanwhile, in the case of transition metal oxide, carriers of the conductive band and the charged band are local and have low mobility. For this reason, hole carriers and electron carriers do not perfectly offset each other. For this reason, in the transition metal oxide, the carriers which have not been offset contribute to electric conduction of the system as hopping conduction.

Figure 9:
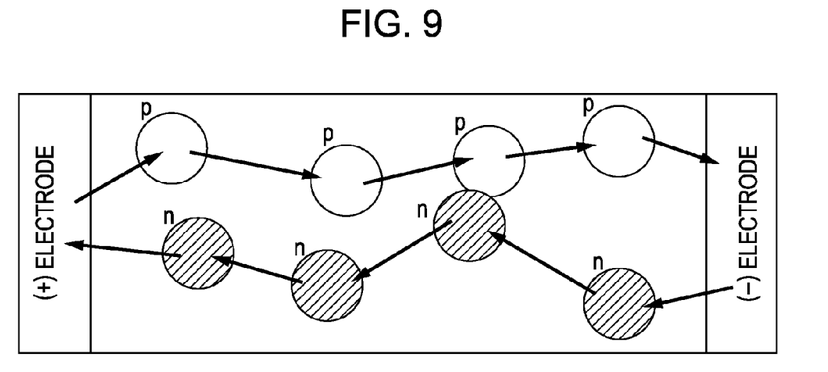
FIG. 9 is a schematic diagram illustrating hopping conduction in a crystal of complex oxide.

FIG. 9 schematically shows the hopping conduction state in the transition metal compound where p-type defects and n-type defects are present. As above, in the transition metal compound, for the p-type defects and the n-type defects, respectively, hopping conduction channels allowing movement of hole carriers and electron carriers are formed. In this circumstance, even though doping is conducted to compensate one of both carriers, the hopping conduction by one of both carriers may not be suppressed any more. This is estimated as a factor deteriorating insulation of $BiFeO_3$.

For this, if an n-type dope element which offsets p-type defects or a p-type dope element which offsets n-type defects is doped to the A site or the B site, it is known that the generation of leakage current may be prevented, and although filed as a separate application, it is also known that leakage may be prevented similar to the p-type result even when nitrogen is doped to the oxygen site, not to the A site or the B site.

The invention is based on the above knowledge, and nitrogen is doped to the oxygen site of complex oxide, which is a transition metal compound such as $BiFeO_3$, to prevent leakage current from occurring by n-type defects, thereby improving insulation. If nitrogen is doped to the oxygen site as described above, when compared with doping to the A site or the B site, there is an advantage in that the piezoelectric characteristics of the complex oxide do not greatly change. In addition, to use the n-type dope element which prevents leak by p-type defects, for an example, it is preferred to further dope cerium (Ce) or manganese (Mn).

Figure 10:
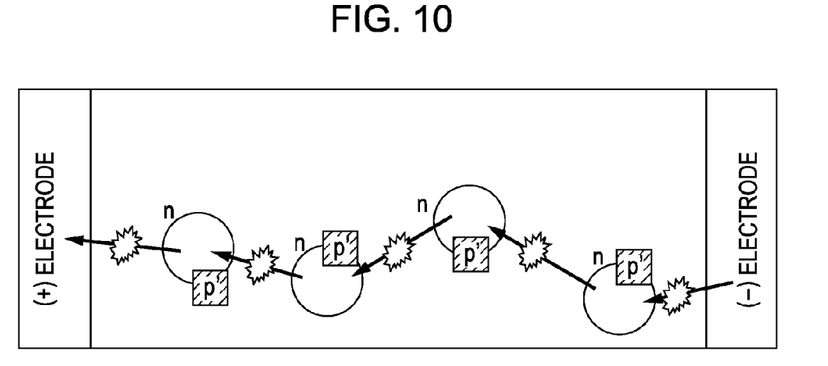
FIG. 10 is a schematic diagram illustrating hopping conduction in a crystal of complex oxide according to the invention.

A schematic diagram of the hopping conduction in the transition metal compound of the invention where nitrogen is doped to the oxygen site is shown in FIG. 10. As shown in FIG. 10, if nitrogen is doped to the oxygen site of complex oxide which is transition metal compound such as $BiFeO_3$, n-type defects are offset by nitrogen doping. For this reason, the leakage current caused by hopping between the n-type defects may greatly decrease.

In other words, in the invention, specifically, for example, nitrogen is doped to the oxygen site of $BiFeO_3$, and the doped nitrogen becomes a p-type donor and offsets n-type defects.

Figure 11:
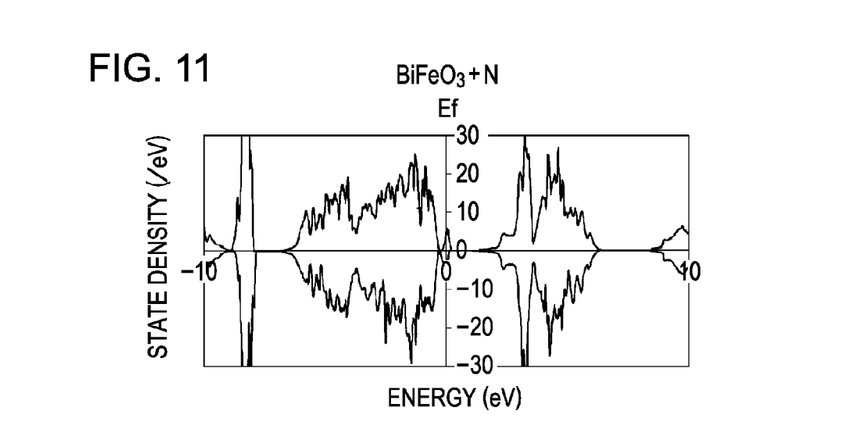
FIG. 11 is a diagram showing density of electron states when 12.5% of oxygen of $BiFeO_3$ is substituted with nitrogen.

FIG. 11 is a diagram showing density of electron states required for using the first principle electron state calculation, for the crystal where 5% of oxygen of the oxygen site is substituted with nitrogen. In addition, the conditions of the first principle electron state calculation are same as described above.

As shown in FIG. 11, if a part of oxygen of $BiFeO_3$ is forcibly substituted with nitrogen, Ef is located at the top of the valence band. In other words, a hole appears in the valence band. In other words, it could be understood that the nitrogen (N) element which substitutes a part of the oxygen site serves as a p-type donor. If integration is performed on the density of electron states with respect to the hole portion, it can be understood that the substitution of oxygen with nitrogen corresponds to the contribution of one hole.

Figure 12:
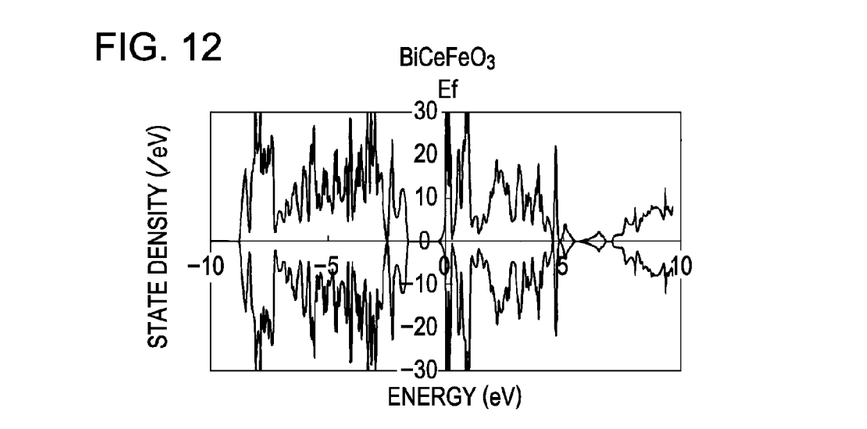
FIG. 12 is a diagram showing density of electron states when 12.5% of Bi of $BiFeO_3$ at the A site is substituted with Ce.

In addition, as shown in FIG. 12, if 12.5% of bismuth (Bi) of $BiFeO_3$ is forcibly substituted with cerium (Ce), Ef is located at the bottom of the conductive band. In other words, it could be understood that the Ce substitution of the A site serves as n-type dopant.

Figure 13:
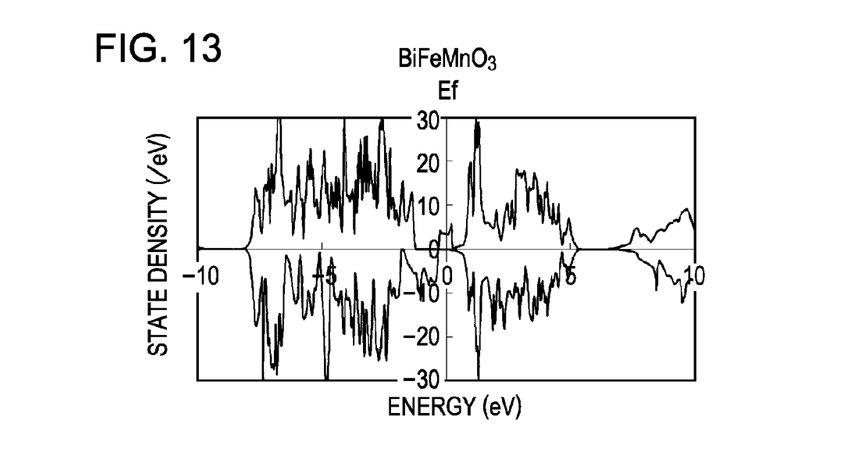
FIG. 13 is a diagram showing density of electron states when 12.5% of Fe of $BiFeO_3$ at the B site is substituted with Mn.

In addition, as shown in FIG. 13, if 12.5% of Fe at the B site of $BiFeO_3$ is forcibly substituted with manganese (Mn), Ef is located at the bottom of the conductive band. In other words, it can be understood that the Mn substitution of the B site serves as n-type dopant.

As described above, in the invention, for example, n-type defects are offset by substituting a part of oxygen at the oxygen site of $BiFeO_3$ with nitrogen (N), thereby maintaining high insulation.

More preferably, p-type defects may also be offset by doping a dope element selected from at least one of cerium (Ce) and manganese (Mn) simultaneously. In other words, by substituting oxygen with nitrogen and doping Ce and Mn, for both n-type and p-type hopping channels in the schematic diagram of FIG. 9, doping may be performed as if they are canceled. As a result, insulation may be maintained to be further higher.

The dope element doped to the oxygen site is preferably doped by an amount corresponding to the amount of expected n-type defects.

In the invention, the complex oxide may include lanthanum with a large ion radius in the A site. Since lanthanum is included, it is possible to prevent a shape other than the Perovskite-type structure from appearing. Further, since lanthanum has a very weak covalent bonding property with the nearest oxygen, compared with bismuth, the potential barrier is lowered with respect to the rotation of polarization moment by an applied electric field. The situation where the rotation of polarization moment tends to occur improves the piezoelectric characteristics. In addition, lanthanum is metal with ion valence of +3, and therefore even though those metal elements are present in the A site, "valence balance" of the invention does not change, and the situation of leakage current is not adversely affected. The content ratio of lanthanum in the A site is preferably equal to or greater than 0.05 and equal to or smaller than 0.20 of a mole ratio, based on the entire amount of bismuth, cerium and lanthanum. Praseodymium, neodymium, and samarium are also elements with great ion radii having ion valence of +3, and therefore give the same effect as lanthanum.

In addition, the complex oxide may include cobalt (Co), chrome (Cr) or both, in addition to iron (Fe) at the B site. Such elements are preferably included at a mole ratio equal to or greater than 0.125 and equal to and smaller than 0.875, based on the entire amount of the elements in the B site. As described above, since the complex oxide includes iron, cobalt and chrome at a predetermined ratio at the location of the B site, insulation and magnetism may be maintained. In addition, since the corresponding complex oxide has a morphotropic phase boundary (MPB), it may have excellent piezoelectric characteristics. In particular, when the mole ratio of cobalt or chrome with respect to the entire amount of iron, cobalt and chrome is near 0.5, for example, a piezoelectric constant increases by the MPB, and therefore the piezoelectric characteristics are specially improved.

Further, the complex oxide preferably further includes barium titanate (for example, $BaTiO_3$ with the Perovskite-type structure) of the stoichiometric composition, in addition to $BiFeO_3$. In this case, at room temperature, MPB appears between $BiFeO_3$ with a rhomborhedral structure and $BaTiO_3$ with a tetragonal structure. For this reason, the piezoelectric characteristic of the piezoelectric layer 70 is improved so that the vibration plate may make a big displacement just with a small voltage. Here, in a case where the piezoelectric layer 70 includes barium titanate, for example, nitrogen is doped with the oxygen site of the complex oxide (for example, (Bi, Ba) (Fe, Ti)$O_3$) with the Perovskite-type structure formed with barium titanate and bismuth ferric acid which is a main component.

The piezoelectric layer 70 of this embodiment has a monosymmetric crystal structure. In other words, the piezoelectric layer 70 made of the complex oxide with the Perovskite-type structure has a monoclinic symmetric property. This piezoelectric layer 70 may obtain a high piezoelectric property. For this reason, a structure where the polarization moment of the piezoelectric layer may easily rotate may be conceived, regarding the electric field applied to a surface in the vertical direction. In the piezoelectric layer, the variation of the polarization moment is directly associated with the variation of the crystal structure, and therefore it securely comes to have the piezoelectric property. From the above, a high piezoelectric property may be obtained for the structure where polarization moment tends to change.

In addition, the piezoelectric layer 70 preferably has an engineered domain arrangement in which the polarization direction is inclined by a predetermined angle (50 degrees to 60 degrees) to the vertical direction to the film surface (the thickness direction of the piezoelectric layer 70).

A lead electrode 90 made of, for example, gold (Au) which is extracted from the vicinity of the end portion of the ink supply path 14 side and installed onto the elastic film 50, or even onto an insulator film which is prepared as necessary, is connected to each second electrode 80 which is an individual electrode of the piezoelectric element 300.

A protective substrate 30 having the manifold portion 31 configuring at least a part of the manifold 100 is adhered by means of an adhesive 35 on the channel-formed substrate 10 where the piezoelectric element 300 is formed, namely on the first electrode 60, the elastic film 50, the insulator film prepared as necessary, or the lead electrode 90. The manifold portion 31 is formed to extend in the width direction of the pressure generating chamber 12 to pass through the thickness direction of the protective substrate 30 in this embodiment to communicate with the communication portion 13 of the channel-formed substrate 10 as described above, thereby configuring the manifold 100 which becomes a common ink chamber of each pressure generating chamber 12. In addition, the communication portion 13 of the channel-formed substrate 10 may be divided in plural for each pressure generating chamber 12, and only the manifold portion 31 may be used as the manifold. Further, for example, it is possible to provide only the pressure generating chamber 12 to the channel-formed substrate 10 so that the ink supply path 14 communicating with each pressure generating chamber 12 is provided to a member (for example, the elastic film 50, the insulator film prepared as necessary, or the like) interposed between the channel-formed substrate 10 and the protective substrate 30 as the manifold 100.

In addition, a piezoelectric element holding unit 32 with a space not disturbing the movement of the piezoelectric element 300 is installed in a region opposite to the piezoelectric element 300 of the protective substrate 30. The piezoelectric element holding unit 32 has a space not disturbing the movement of the piezoelectric element 300, and the space may be sealed or not sealed.

The protective substrate 30 may be made of material with substantially the same coefficient thermal expansion as the channel-formed substrate 10, for example glass, ceramic material or the like, and in this embodiment, it is formed with a silicon single crystal substrate with the same material as the channel-formed substrate 10.

In addition, A through hole 33 formed to pass through the protective substrate 30 in the thickness direction is formed in the protective substrate 30. In addition, the vicinity of the end portion of the lead electrode 90 appearing from the piezoelectric element 300 is installed to expose in the through hole 33.

In addition, a driving circuit 120 for driving the installed piezoelectric element 300 is fixed on the protective substrate 30. The driving circuit 120 may use, for example, a circuit substrate, a semiconductor integrated circuit (IC), or the like. In addition, the driving circuit 120 and the lead electrode 90 are electrically connected via a connection wire 121 made of conductive wire such as bonding wire.

In addition, a compliance substrate 40 composed of a sealing film 41 and a fixed plate 42 is adhered on the protective substrate 30. Here, the sealing film 41 is made of material with flexibility and low rigidity, so that one side surface of the manifold portion 31 is sealed by the sealing film 41. In addition, the fixed plate 42 is made of relatively rigid material. Since a region of the fixed plate 42 opposite to the manifold 100 becomes an opening 43 perfectly removed in the thickness direction, the one side surface of the manifold 100 is sealed by only the sealing film 41 with flexibility.

In the ink jet recording head I of this embodiment, the ink is obtained from an ink inlet hole connected to an external ink supply unit (not shown) so that the inside is filled with the ink from the manifold 100 to the nozzle opening 21, and then voltage is applied between the first electrode 60 and the second electrode 80 respectively corresponding to the pressure generating chamber 12 according to the recording signal from the driving circuit 120 to flexural-deform the elastic film 50, the adhesion film 56, the first electrode 60 and the piezoelectric layer 70, so that the pressure in each pressure generating chamber 12 increases to discharge ink droplets from the nozzle opening 21.

Next, an example of a method of manufacturing the ink jet recording head according to this embodiment will be described with reference to FIGS. 14A to 18B. In addition, FIGS. 14A to 18B are longitudinal sectional views of the pressure generating chamber.

Figure 14A:
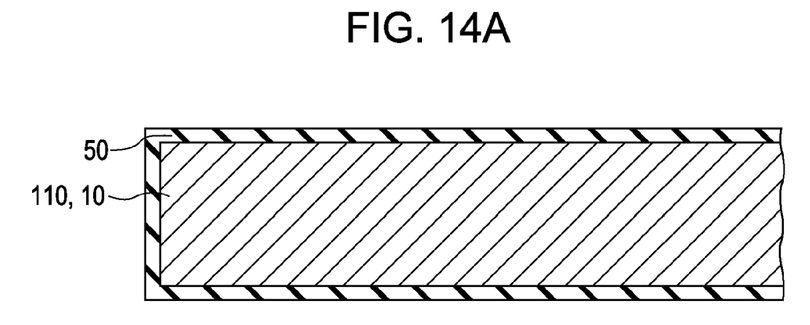
FIGS. 14A and 14B are sectional views showing a recording head manufacturing process according to the first embodiment.
Figure 14B:
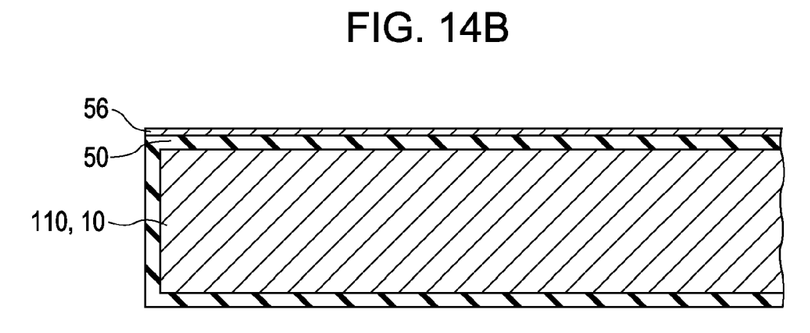

First, as shown in FIG. 14A, a silicon dioxide film made from silicon dioxide ($SiO_2$) or the like configuring the elastic film 50 is formed by thermal oxidation or the like on the surface of a wafer 110 for the channel-formed substrate which is a silicon wafer. Then, as shown in FIG. 14B, an adhesion film 56 made from titanium oxide or the like is formed by thermal oxidation or the like on the elastic film 50 (the silicon dioxide film).

Figure 15A:
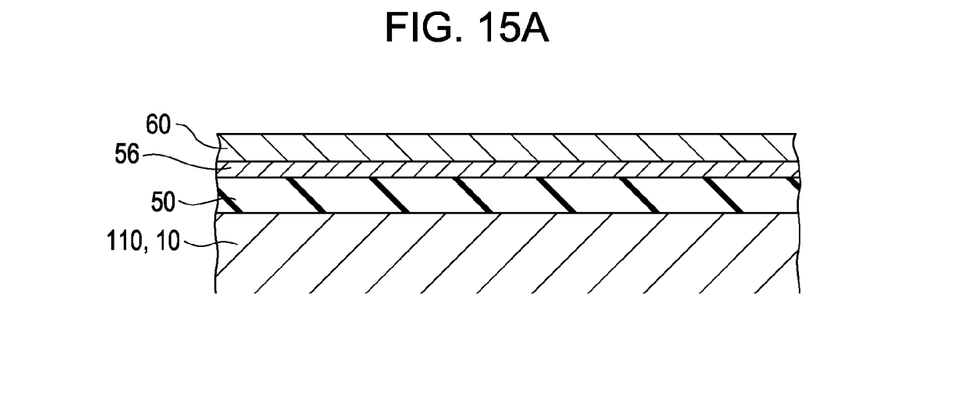
FIGS. 15A to 15C are sectional views showing the recording head manufacturing process according to the first embodiment.

Next, as shown in FIG. 15A, a platinum film configuring the first electrode 60 is formed by sputtering or the like on the entire surface of the adhesion film 56.

After that, the piezoelectric layer 70 is laminated on the platinum film. The piezoelectric layer 70 may be a metal organic decomposition (MOD) method which obtains a piezoelectric layer (or, a piezoelectric film) made from metal oxide by applying and drying a solution containing a metal compound and firing at higher temperature, a chemical solution method such as a sol-gel method, or a vapor method such as sputtering. In addition, the piezoelectric layer 70 may also be formed by methods such as laser ablation, spattering, pulse laser deposition (PLD), CVD, aerosol deposition, or the like, other than the above.

Figure 15B:
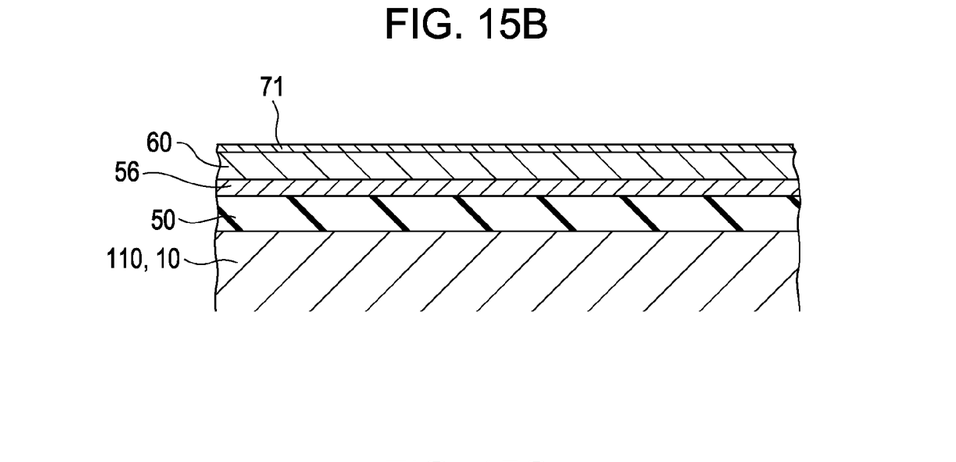

Regarding the detailed forming order example of the piezoelectric layer 70, first, as shown in FIG. 15B, a metal compound, in detail, a sol or MOD solution (precursor solution) including a complex containing Bi and Fe, La contained as necessary or Co, Cr, cerium contained as necessary, and manganese at a desired composition ratio is applied on the first electrode 60 by spin coating to form a piezoelectric precursor film 71 (a coating process).

The applied precursor solution is obtained by mixing a metal complex which may form a complex oxide containing Bi and Fe, La contained as necessary or Co, Cr, cerium, and manganese so that each metal has a desired mole ratio, and dissolving or dispersing the corresponding mixture with a compound containing nitrogen in an organic solvent such as alcohol or the like.

The term "metal complex which may form a complex oxide containing Bi and Fe, La contained as necessary or Co, Cr, cerium, and manganese" used herein represents a mixture of a metal complex containing Bi and Fe, La contained as necessary or Co, Cr, Ce, and Mn. The complex respectively including Bi and Fe, La contained as necessary or Co, Cr, Ce, and Mn may use, for example, alkoxide, organic acid salt, β-diketone complex, or the like.

The metal compound containing Bi may be, for example, 2-ethyl hexane acid bismuth or the like. The metal compound containing Fe may be, for example, 2-ethyl hexane acid iron or the like. The metal compound containing Co may be, for example, 2-ethyl hexane acid cobalt or the like. The metal compound containing Cr may be, for example, 2-ethyl hexane acid chrome or the like. The metal compound containing Mn may be, for example, 2-ethyl hexane acid manganese or the like. The metal compound containing La may be, for example, 2-ethyl hexane acid lanthanum or the like. The metal compound containing Ce may be, for example, 2-ethyle hexane acid cerium or the like. In addition, a metal compound containing two or more of Bi, Ce, Fe, Co, Mn, and La may also be used. In addition, the compound containing nitrogen may be ammonia, diethanol amine, or the like.

After that, the piezoelectric precursor film 71 is dried for a predetermined time (a drying process) by heating at predetermined temperature (150 to 400° C.). Next, the dried piezoelectric precursor film 71 is heated at predetermined temperature and kept for a predetermined time for dilapidation (a dilapidation process). In addition, the dilapidation used herein means to make organic components included in the piezoelectric precursor film 71 be separated as, for example, $NO_2$, $CO_2$, $H_2O$ or the like. The circumference of the drying process and the dilapidation process is not limited, but those processes may be performed in the atmosphere or in an inert gas.

Figure 15C:
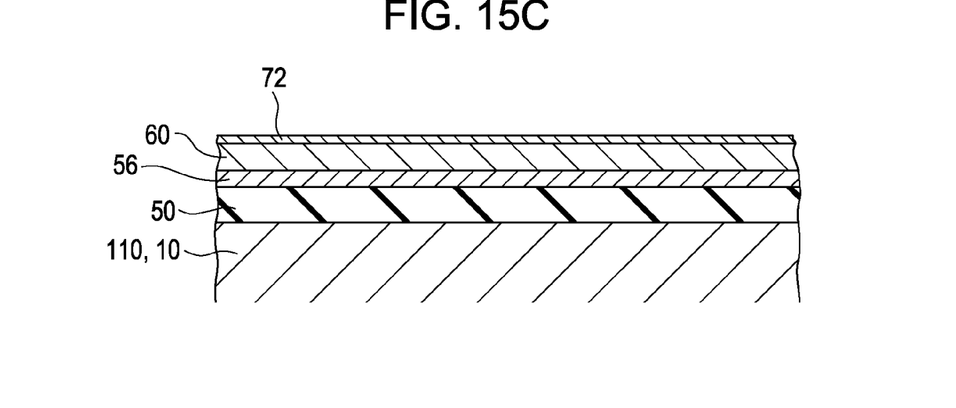

Next, as shown in FIG. 15C, the piezoelectric precursor film 71 is crystallized by being heated at temperature of, for example, about 600 to 800° C., and kept for a predetermined time to form a piezoelectric film 72 (a firing process). In the firing process, the circumstances are not limited, and this process may be performed in the atmosphere or in an inert gas.

In addition, a heating device used for the drying process, the dilapidation process and the firing process may be, for example, a rapid thermal annealing (RTA) device for heating by the irradiation of infrared lamp, a hot plate or the like.

At this time, if the content of nitrogen included in the piezoelectric film is investigated by the analysis using a secondary ion mass spectrometry (SIMS), the content has a mole ratio of 0.01 or less, with an order of about 0.001. In addition, if the nitrogen mole ratio is 0.0005 or less, the effect as a p-type dope of the invention is deteriorated.

Figure 16A:
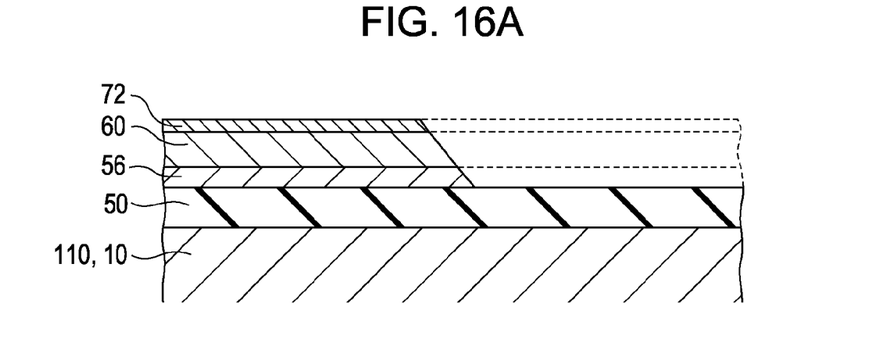
FIGS. 16A and 16B are sectional views showing the recording head manufacturing process according to the first embodiment.

Next, as shown in FIG. 16A, a register (not shown) of a predetermined shape is patterned on the piezoelectric film 72 as a mask so that the sides of the first electrode 60 and the piezoelectric film 72 are slanted with a first level.

Figure 16B:
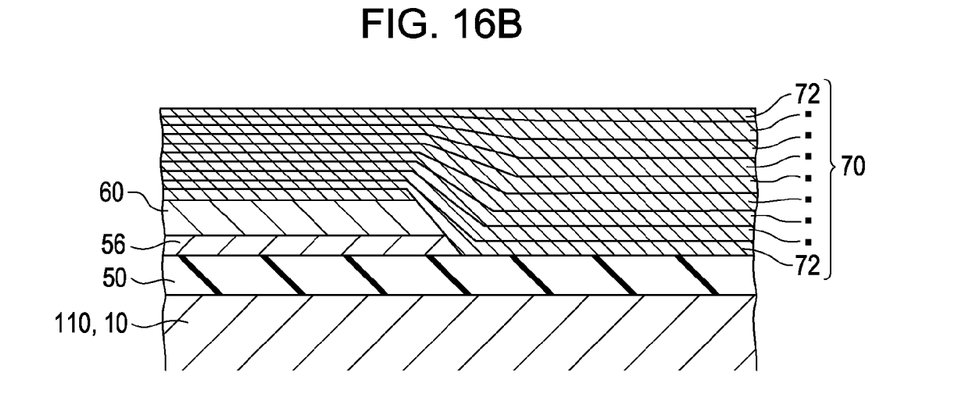

After that, the register is peeled off, and then the coating process, the drying process and the dilapidation process, as described above, or the coating process, the drying process, the dilapidation process and the firing process are repeated several times according to a desired film thickness to form the piezoelectric layer 70 composed of a plurality of piezoelectric films 72, and therefore the piezoelectric layer 70 of a predetermined thickness composed of a plurality of piezoelectric films 72 is formed as shown in FIG. 16B. For example, in a case where a film thickness obtained by one coating process of the coating solution is about 0.1 μm, for example, the film thickness of the entire piezoelectric layer 70 composed of ten layers of the piezoelectric films 72 becomes about 1.1 μm. In addition, in this embodiment, even though the piezoelectric films 72 are laminated, it is also possible to use a single layer of the piezoelectric film 72.

After the piezoelectric layer 70 is formed as described above, as shown in FIG. 17A, the second electrode 80 made of platinum or the like is formed on the piezoelectric layer 70 by sputtering or the like to pattern the piezoelectric layer 70 and the second electrode 80 together in a region opposite to each pressure generating chamber 12, and the piezoelectric element 300 is formed by the first electrode 60, the piezoelectric layer 70 and the second electrode 80. In addition, the patterning of the piezoelectric layer 70 and the second electrode 80 may be performed in a bundle by performing dry etching by means of a register (not shown) formed with a predetermined shape. After that, as necessary, post-annealing may be performed in a temperature range of 600° C. to 800° C. By doing so, an excellent interface may be formed between the piezoelectric layer 70 and the first electrode 60 or the second electrode 80, and the crystalline property of the piezoelectric layer 70 may be improved.

Figure 17A:
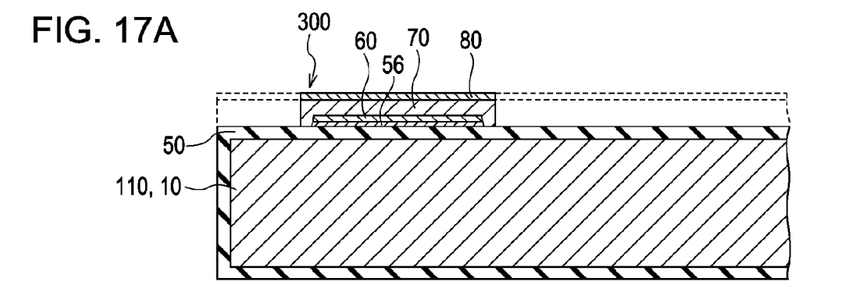
FIGS. 17A to 17C are sectional views showing the recording head manufacturing process according to the first embodiment.
Figure 17B:
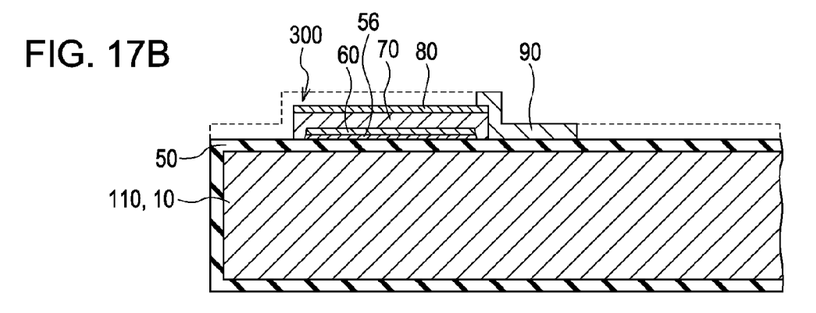

Next, as shown in FIG. 17B, the lead electrode 90 made of, for example, gold (Au) or the like is formed on the entire surface of a wafer 110 for the channel-formed substrate, and then each piezoelectric element 300 is patterned by means of a mask pattern (not shown) made of, for example, register or the like.

Figure 17C:
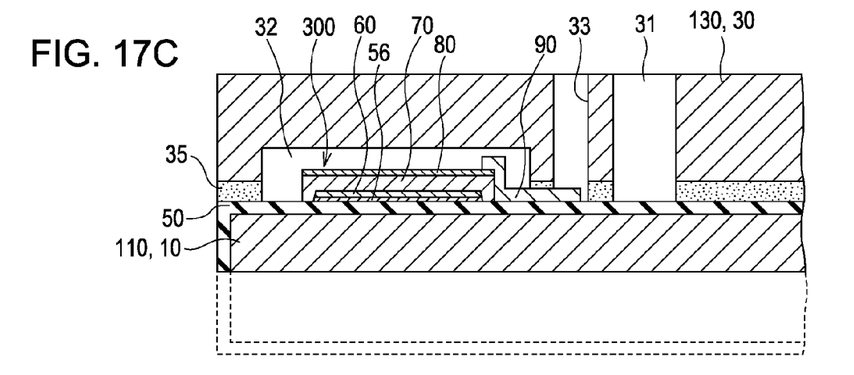

Next, as shown in FIG. 17C, a wafer 130 for the protective substrate, which is a silicon wafer and becomes a plurality of protective substrates 30, is adhered by means of the adhesive 35 to the piezoelectric element 300 of the wafer 110 for the channel-formed substrate, and then the wafer 110 for the channel-formed substrate is processed to have a predetermined thin thickness.

Figure 18A:
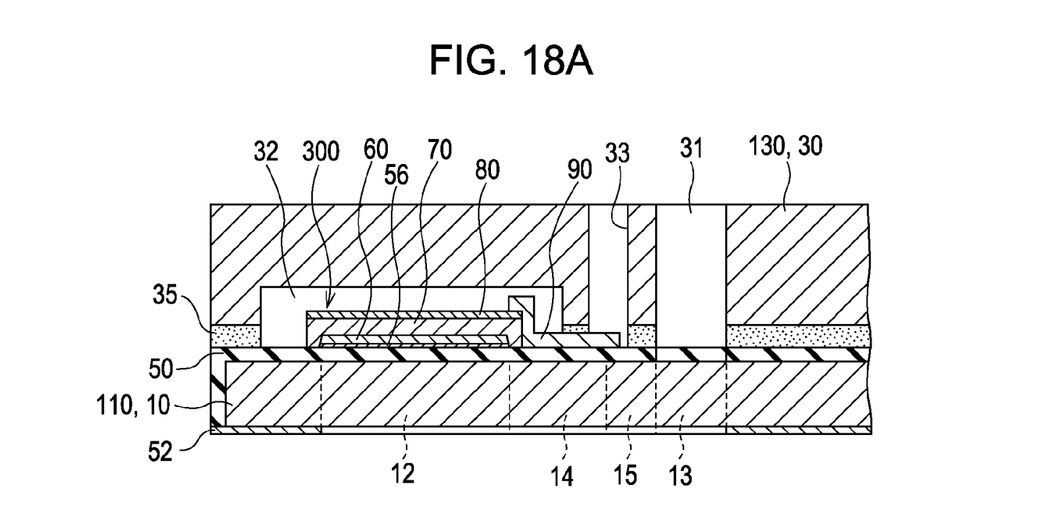
FIGS. 18A and 18B are sectional views showing the recording head manufacturing process according to the first embodiment.

Next, as shown in FIG. 18A, a mask film 52 is newly formed on the wafer 110 for the channel-formed substrate to pattern a predetermined shape.

Figure 18B:
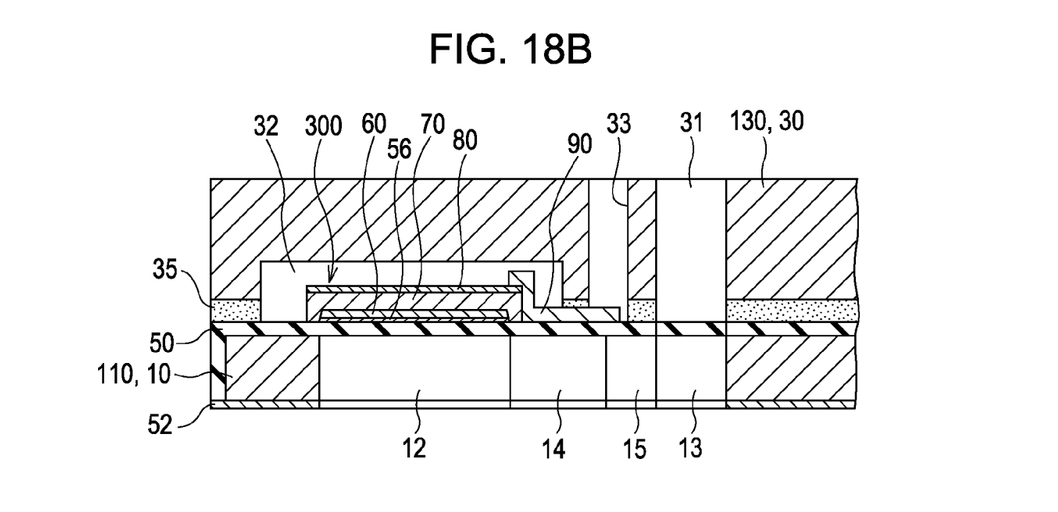

In addition, as shown in FIG. 18B, anisotropic etching (wet etching) using an alkali solution such as KOH is performed to the wafer 110 for the channel-formed substrate by using the mask film 52 to form the pressure generating chamber 12, the communication portion 13, the ink supply path 14, the communication path 15 or the like, which correspond to the piezoelectric element 300.

After that, unnecessary portions in the outer circumferences of the wafer 110 for the channel-formed substrate and the wafer 130 for the protective substrate are cut off by, for example, dicing or the like and removed. In addition, the mask film 52 at the surface of the wafer 110 for the channel-formed substrate, which is opposite to the wafer 130 for the protective substrate, is removed, and then the nozzle plate 20 in which the nozzle opening 21 is formed is adhered thereto, and simultaneously, the compliance substrate 40 is adhered to the wafer 130 for the protective substrate so that the wafer 110 for the channel-formed substrate or the like is divided into the channel-formed substrates 10 with a tip size as shown in FIG. 1, thereby manufacturing the ink jet recording head I of this embodiment.

Another Embodiment

Heretofore, one embodiment of the invention has been described, but the basic configuration of the invention is not limited to the above description. For example, even though the channel-formed substrate 10 is a silicon single crystal substrate in the above embodiment, it may use, for example, an SOI substrate or material such as glass or the like, without being limited to the above.

Further, even though the piezoelectric element 300 in which the first electrode 60, the piezoelectric layer 70 and the second electrode 80 are laminated in order on the substrate (the channel-formed substrate 10) is illustrated in the above embodiment, a vertical-vibrating piezoelectric element in which piezoelectric material and electrode-forming material are laminated with each other and extend or shrink in an axial direction may also be applied to the invention as an example, without being limited to the above.

Figure 19:
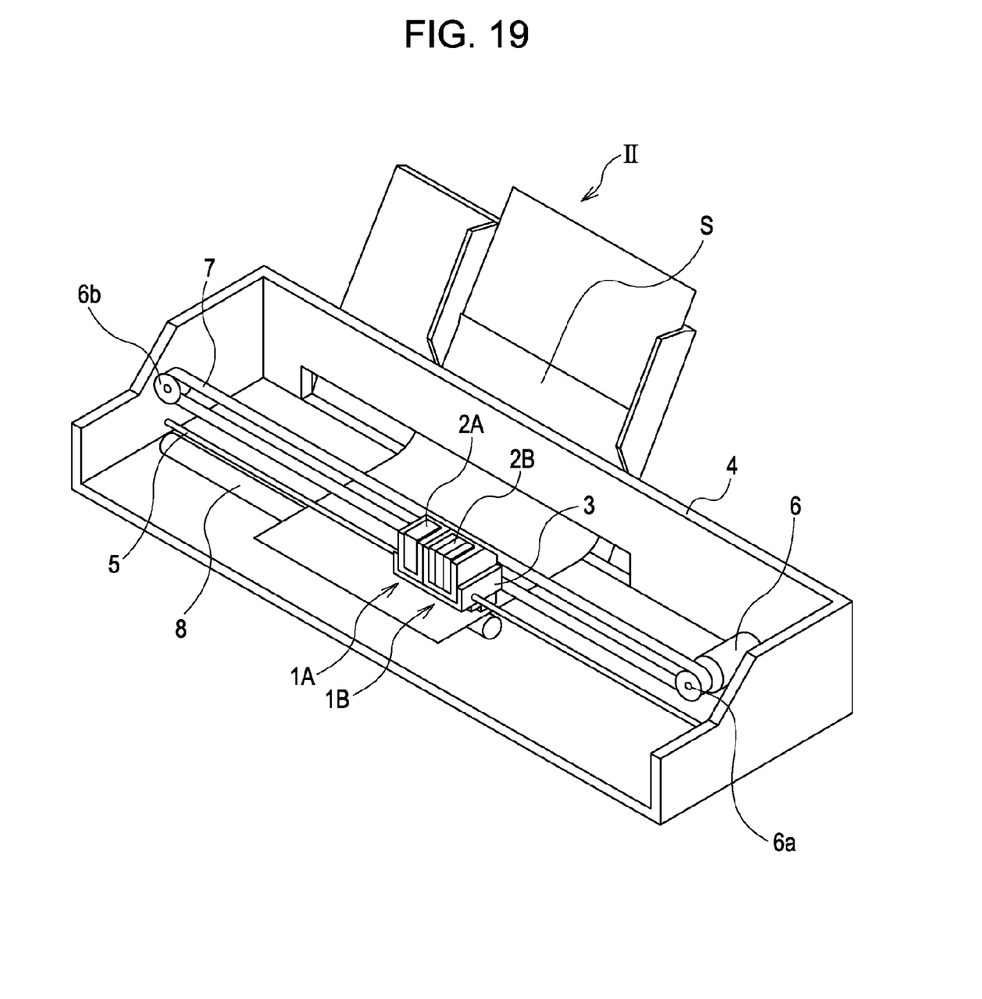
FIG. 19 is a diagram showing a schematic configuration of a recording apparatus according to an embodiment of the invention.

In addition, the ink jet recording head of these embodiments configures a part of a recording head unit having an ink channel communicating with an ink cartridge or the like and is loaded on an ink jet recording apparatus. FIG. 19 is a schematic view showing an example of the ink jet recording apparatus II.

As shown in FIG. 19, the recording head units 1A and 1B having the ink jet recording head I include cartridges 2A and 2B serving as an ink supply unit detachably installed thereto, and a cartridge 3 on which the recording head units 1A and 1B are loaded is installed to be movable in the axial direction of a cartridge shaft 5 mounted to an apparatus body 4. The recording head units 1A and 1B discharge, for example, black ink composition and color ink composition, respectively.

In addition, the driving force of a driving motor 6 is transferred to the cartridge 3 via a plurality of toothed wheels (not shown), and a timing belt 7, and the cartridge 3 on which the recording head units 1A and 1B are loaded moves along the cartridge shaft 5. Meanwhile, a platen 8 is installed to the apparatus body 4 along the cartridge shaft 5 so that a recording sheet S which is a recording medium such as paper or the like fed by feeding rollers or the like (not shown) may be rolled around the platen 8 and carried out.

In the example shown in FIG. 19, the ink jet recording head units 1A and 1B respectively have a single ink jet recording head I, but one ink jet recording head unit 1A or 1B may have two or more ink jet recording heads as an example, without being limited to the above.

In addition, even though it has been described in the above embodiment that the ink jet recording head is an example of the liquid ejecting head, the invention is targeted at a broad range of liquid ejecting heads and may be applied to a liquid ejecting head which ejects liquid other than ink. Other liquid ejecting heads may include, for example, various kinds of recording heads used for an image recording apparatus such as a printer, color material ejecting heads used for making color filters of liquid crystal displays or the like, electrode material ejecting heads used for forming electrodes of organic EL displays, field emission displays (FED) or the like, biological organic substance ejecting heads used for making bio chips, or the like.

The piezoelectric element of the invention may be applied to a piezoelectric element of a liquid ejecting head, which is representatively an ink jet recording head, as described above in order to show good insulation and piezoelectric characteristics, but it is not limited thereto. For example, it may be applied to piezoelectric elements of ultrasonic devices of ultrasonic transmitters, ultrasonic motors, piezoelectric transformers, and various sensors such as infrared sensors, ultrasonic sensors, temperature sensors, pressure sensors, pyroelectric sensors or the like. In addition, the invention may be applied to ferroelectric elements such as ferroelectric memories or the like in the same manner.

What is claimed is:

1. A piezoelectric element comprising:
   a piezoelectric layer; and
   an electrode provided to the piezoelectric layer,
   wherein the piezoelectric layer has a Perovskite-type structure containing bismuth and iron and having a plurality of expected n-type defects, and includes nitrogen that has been doped to an oxygen site of the Perovskite-type structure, an amount of the nitrogen doped to the oxygen site corresponding to the plurality of expected n-type defects.

2. The piezoelectric element according to claim 1, wherein the piezoelectric layer includes nitrogen by a mole ratio equal to or greater than 0.0005 and equal to or smaller than 0.01.

3. The piezoelectric element according to claim 1, wherein the bismuth is partially included in a B site.

4. The piezoelectric element according to claim 1, wherein the complex oxide further includes titanium and barium in addition to bismuth and iron.

5. A liquid ejecting head comprising the piezoelectric element according to claim 1.

6. A liquid ejecting apparatus comprising the liquid ejecting head according to claim 5.

* * * * *